US012381124B2

(12) United States Patent
Singh et al.

(10) Patent No.: US 12,381,124 B2
(45) Date of Patent: Aug. 5, 2025

(54) DEPOSITION OF A THIN FILM NANOCRYSTALLINE DIAMOND ON A SUBSTRATE

(71) Applicant: The Board of Regents for the Oklahoma Agricultural and Mechanical Colleges, Stillwater, OK (US)

(72) Inventors: Raj N. Singh, Tulsa, OK (US); Nirmal Govindaraju, Tulsa, OK (US)

(73) Assignee: The Board of Regents for Oklahoma Agricultural and Mechanical Colleges, Stillwater, OK (US)

( * ) Notice: Subject to any disclaimer, the term of this patent is extended or adjusted under 35 U.S.C. 154(b) by 339 days.

(21) Appl. No.: 17/934,850

(22) Filed: Sep. 23, 2022

(65) Prior Publication Data

US 2023/0102356 A1  Mar. 30, 2023

Related U.S. Application Data

(60) Provisional application No. 63/249,895, filed on Sep. 29, 2021.

(51) Int. Cl.
*H01L 23/373* (2006.01)
*C01B 32/15* (2017.01)
*C23C 16/02* (2006.01)
*C23C 16/27* (2006.01)
*H01L 21/02* (2006.01)

(52) U.S. Cl.
CPC ...... *H01L 23/3732* (2013.01); *C23C 16/0245* (2013.01); *C23C 16/27* (2013.01); *H01L 21/02115* (2013.01); *H01L 21/02271* (2013.01); *H01L 21/02315* (2013.01)

(58) Field of Classification Search
CPC .......... H01L 23/3732; H01L 21/02115; H01L 21/02271; H01L 21/02315; C23C 16/0245; C23C 16/27; C01B 32/15
See application file for complete search history.

(56) References Cited

U.S. PATENT DOCUMENTS 7,128,889 B2 * 10/2006 Carlisle ................. C23C 16/279
                                                423/446
10,910,127 B2 *  2/2021 Xu ......................... C23C 16/274
(Continued)

FOREIGN PATENT DOCUMENTS

CN          109422262 A   *  3/2019  ............. B82Y 30/00

OTHER PUBLICATIONS

Govindaraju et al., "Processing of Nanocrystalline diamond thin films for thermal management of wide-bandgap semiconductor power electronics", 2011, Materials Science and Engineering B 176, pp. 1058-1072, Elsevier B.V., 15 pages.

(Continued)

*Primary Examiner* — Jeff W Natalini
*Assistant Examiner* — Brandon C Fox
(74) *Attorney, Agent, or Firm* — DUNLAP CODDING , P.C.

(57) ABSTRACT

Disclosed are methods for providing a thin film of nanocrystalline diamond grown on 6 nm nanocrystalline diamond powder on the surface of substrates. The thin film of nanocrystalline diamond can be deposited on wide-bandgap semiconducting devices to provide heat dissipation characteristics to the semiconducting devices.

19 Claims, 16 Drawing Sheets

(56) References Cited

U.S. PATENT DOCUMENTS

2014/0255701 A1* 9/2014 Lee .................. H01B 1/04
252/502
2016/0197027 A1* 7/2016 Nasser-Faili ........ H01L 29/2003
257/76

OTHER PUBLICATIONS

Govindaraju et al., "High-temperature Dielectric Behavior of Nanocrystalline and Microcrystalline Diamond Thin Films", Cincinnati, OH, 14 pages.

Das et al., "Thermal conductivity of diamond films deposited at low surface temperatures", Sep. 2006, Journal of Materials Research, 11 pages.

* cited by examiner

| Powder | Slurry Vial I.D. | Particle Size (nm) | Zeta Potential | Description |
|---|---|---|---|---|
| P1 | 6nm_D_121615 | 1912 | 22.87 | DND Powder from Bag |
| | 6nm_AO_121615 | 290.47 | -53.37 | First AO |
| | 6nm_AO_G_121516 | 1343.3 | 23.2 | AO and Graphitized |
| | 6nm_AO_G_AO_121516 | 269.03 | -53.57 | Second AO |
| P2 | 6nm_D_052716 | 895.2 | 32.97 | DND Powder from Bag |
| | 6nm_AO_052716 | 389.4 | -46.1 | First AO |
| | 6nm_AO_G_052716 | 1778.7 | 25.63 | AO and Graphitized |
| | 6nm_AO_G_AO_052716 | 313.4 | -53.37 | Second AO |

FIG. 2

| pH | Size | Zeta | Avg.size | SD | Avg.Zeta | SD |
|---|---|---|---|---|---|---|
| 4 | 322.6 | -29.2 | 321.8 | 1.3 | -29.533 | 0.4932 |
|  | 322.5 | -29.3 |  |  |  |  |
|  | 320.3 | -30.1 |  |  |  |  |
| 5 | 348.1 | -31 | 357.366 | 9.0577 | -31.033 | 0.75055 |
|  | 357.8 | -30.3 |  |  |  |  |
|  | 366.2 | -31.8 |  |  |  |  |
| 9 | 260.1 | -39.6 | 255.5 | 4.9274 | -39.8333 | 1.3605 |
|  | 250.3 | -38.6 |  |  |  |  |
|  | 256.1 | 41.3 |  |  |  |  |
| 10 | 232.2 | -37 | 233.1333 | 1.8823 | -37.533 | 0.6806 |
|  | 231.9 | -37.3 |  |  |  |  |
|  | 235.3 | -38.3 |  |  |  |  |
| 11 | 227.3 | -36 | 227.5333 | 1.06928 | -37.5 | 1.6703 |
|  | 226.6 | -37.2 |  |  |  |  |
|  | 228.7 | -39.3 |  |  |  |  |
| 12 | 232.1 | -39.7 | 230 | 1.8193 | -46.3667 | 6.2915 |
|  | 228.9 | -47.2 |  |  |  |  |
|  | 229 | -52.2 |  |  |  |  |

FIG. 4 ial Application No. 63/249,895, the disclosure of which is incorporated herein by reference in its entirety.

DEPOSITION OF A THIN FILM NANOCRYSTALLINE DIAMOND ON A SUBSTRATE

CROSS REFERENCE TO RELATED APPLICATION

The present patent application claims priority to a provisional patent application identified by U.S. Provisional Application No. 63/249,895, the disclosure of which is incorporated herein by reference in its entirety.

BACKGROUND

Dissipation of heat is critical to the efficient operation of SiC and GaN wide-bandgap semiconductor devices. Miniaturization of these devices leads to density increases and an accompanying increase in self-heating. To continue development of such miniaturized semiconductor devices, improvements in the heat dissipation must be made. Diamond has several material properties which lend it to device-level thermal management of SiC and GaN power devices. However, a need exists for applying an effective layer of diamond to such devices to remove heat.

BRIEF DESCRIPTION OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

FIG. 2 is a table illustrating particle size and zeta potential of two samples of nanocrystalline diamond which has been subjected to a purification and deaggregation process of air oxidation, graphitization, and air oxidation in accordance with the presently disclosed inventive concepts.

FIG. 4 is a table illustrating an impact of pH on particle size and zeta values of nanocrystalline diamond powder where NaOH is used as a suspending solvent.

FIG. 11A and FIG. 11B illustrate a first feature of the substrate at different magnifications and images FIG. 11C and FIG. 11D illustrate a second feature of the substrate at different magnifications.

FIG. 12A and FIG. 12B illustrate a first feature of the substrate at different magnifications and images FIG. 12C and FIG. 12D illustrate a second feature of the substrate at different magnifications.

DETAILED DESCRIPTION

Figure 1:
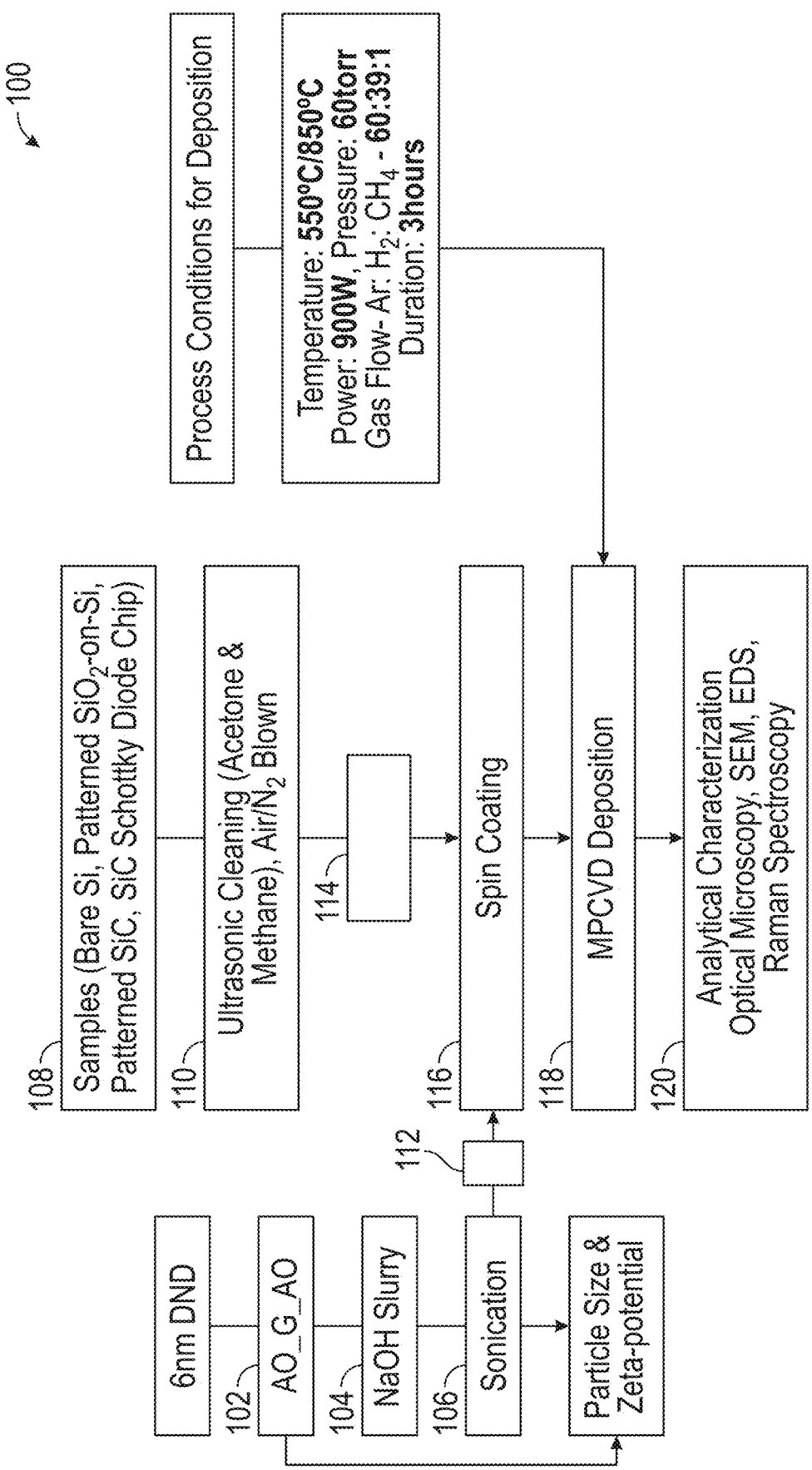
FIG. 1 is a flow chart depicting steps of an exemplary method for applying a thin film nanocrystalline diamond layer to a substrate in accordance with the presently disclosed inventive concepts.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The systems and methods as described in the present disclosure are capable of other embodiments or of being practiced or carried out in various ways. Also, it is to be understood that the phraseology and terminology employed herein is for purposes of description, and should not be regarded as limiting.

The following detailed description refers to the accompanying drawings. The same reference numbers in different drawings may identify the same or similar elements.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, any reference to "one embodiment," "an embodiment," "some embodiments," "one example," "for example," or "an example" means that a particular element, feature, structure or characteristic described in connection with the embodiment is included in at least one embodiment. The appearance of the phrase "in some embodiments" or "one example" in various places in the specification is not necessarily all referring to the same embodiment, for example.

The current disclosure provides methods for preparing thin films of nanocrystalline diamond suitable for dissipating heat generated by wide-bandgap semiconducting devices. The resulting nanocrystalline diamond thin film is a coalesced material having high density and a smooth surface. Formed in situ, the thin film of nanocrystalline diamond does not damage the underlying substrate or device. The thin film of nanocrystalline diamond may be in a range from 1 µm to 5 µm thick. When grown on the surface of a wide-bandgap semiconducting device, the thin film of nanocrystalline diamond will draw heat directly from the device. For the remainder of this disclosure the thin film nanocrystalline diamond will be referred to as TFND.

To deposit a TFND on a substrate, a nanocrystalline diamond powder is used as a seeding medium. Nanocrystalline diamond powder having particle sizes of about 4 nm to about 8 nm may be used in the disclosed method. More preferably, the nanocrystalline diamond powder will have particle sizes of approximately 5 nm to approximately 7 nm. A preferred size for the nanocrystalline diamond powder is 6 nm.

Nanocrystalline diamond powders having the disclosed size range will quickly form the desired coalesced films and will efficiently fill etched or patterned surfaces while reducing interface resistances. While the disclosed particle sizes are advantageous for the formation of the desired final TFND, these particles tend to form aggregates. Therefore, the following discussion will describe the specially developed methods required for forming the desired TFND.

The methods disclosed herein provide the ability to deposit TFND as a smooth, conformal, and coalesced thermal interface material layer on wide-bandgap semiconductor devices. Preferably, the resulting TFND has a thickness of less than 1 µm. Typically, the resulting TFND has a thickness of about 200 nm to about 800 nm.

Referring now to FIG. 1, shown therein is a method 100 for preparing the TFND that begins with purification and deaggregation of the nanocrystalline diamond powder in step 102. The purification and deaggregation process includes the following steps:

A first air oxidation is performed on the nanocrystalline diamond powder by placing the nanocrystalline diamond powder in a furnace or other suitable reactor operating at a temperature of between 450° C. to 600° C. for a period of time sufficient to remove non-diamond carbon phases. In one exemplary embodiment, the furnace may be operated at a temperature of approximately 450° C. for approximately four hours. It should be noted that the furnace temperature may be ramped up and down at a rate of about 10° C./minute during the first air oxidation process.

The air oxidized nanocrystalline diamond powder is then graphitized by heating the air oxidized nanocrystalline diamond powder in the furnace to a temperature between 700° C. to 950° C. to graphitize a portion of the surface of the particles of the air oxidized nanocrystalline diamond powder. In an exemplary embodiment, the furnace may be operated at a temperature of approximately 900° C. for approximately one hour. It should be noted that the furnace temperature may vary up and down at a rate of about 15° C./minute during the graphitization step.

A second air oxidation step is performed by placing the graphitized nanocrystalline diamond powder in the furnace at a temperature of between 450° C. to 600° C. to remove graphite formed during the graphitization step thereby providing deaggregated nanocrystalline diamond powder. In one exemplary embodiment, the furnace may be operated at a temperature of approximately 450° C. for approximately four hours. It should be noted that the furnace temperature may vary up and down at a rate of about 10° C./minute during the second air oxidation process.

The purified and deaggregated nanocrystalline diamond powder is placed in suspension in an appropriate solvent in step 104. Suitable solvents include, but are not limited to, water, ethanol, methanol, acetone, NaOH, and KOH. One particularly suited solvent is NaOH adjusted to a pH of 12. For the purposes of illustration, and not by way of limitation, the following discussion describes the suspension of nanocrystalline diamond powder in NaOH at a pH of 12.

The nanocrystalline diamond powder is suspended in the NaOH to provide a suspension having from approximately 10 g/l to approximately 50 g/l of nanocrystalline diamond powder. For the purposes of illustration, and not by way of limitation, a suspension containing between approximately 25 mg and 30 mg per milliliter of NaOH will be used. To provide a homogenous suspension, the mixture of nanocrystalline diamond powder in NaOH is sonicated in step 106. The sonication step 106 may take place using a sonicator having an output frequency of between 5 kHz to 30 kHz and a maximum output voltage of between 50 Vrms to 80 Vrms. In an exemplary embodiment, the sonication step 106 may take place with the sonicator set at 20 kHz output frequency and 70 Vrms. Sonication generally takes place using a sonication time of approximately 1 second "on" to 2 seconds "off". Sonication may take place for a total duration of from thirty minutes up to 18. The sonication step 106 will generally be determined by the size and viscosity of the nanocrystalline diamond powder in NaOH suspension to be sonicated.

After preparation of the desired suspension, the nanocrystalline diamond powder suspended in NaOH is ready for seeding on a surface of a desired substrate 108. Possible substrates include, but are not limited to, bare silicone, silicone dioxide patterned on silicone, patterned silicon carbide, and a silicon carbide Schottky diode chip. For the purposes of illustration, and not by way of limitation, an exemplary substrate 108 comprising silicon (Si) wafers carrying a pattern of silicon dioxide ($SiO_2$) on their surface was tested and will be described to demonstrate the application of nanocrystalline diamond powder. The exemplary $SiO_2$ pattern had a thickness of about 1 µm and was deposited using enhanced chemical vapor deposition (CVD). Following application of the $SiO_2$ layer on the surface of the Si wafer, photolithography techniques were used to etch the desired pattern in the surface layer of $SiO_2$. The pattern may have striations ranging from 2 µm to 3 µm to several hundred microns. For the purposes of the following description, the substrate had striations of about 1 µm wide and 2 µm to 3 µm deep.

In step 110, the substrate 108 is prepared. Substrate 108 preparation involves cleaning of the substrate 108 with solvents suitable for removing trace organic materials. Suitable solvents include, but are not limited to, acetone, methanol, and ethanol. In some embodiments, the cleaning step 110 may involve cleaning the substrate 108 with a first solvent such as acetone followed by a second solvent such as methanol. In another embodiment, an ultrasonic bath containing the desired solvents may be used to further enhance cleaning of the substrate 108 in the cleaning step 110.

In step 112, polyethyleneimine (PEI) may be added to the suspension to provide a suspension having between approximately 1 to approximately 10 percent PEI by weight to prepare the suspension of nanocrystalline diamond powder for seeding on the substrate 108. In an exemplary embodiment, the suspension will have approximately 2.5% PEI by weight. The addition of PEI to the nanocrystalline diamond powder suspension promotes adhesion of the nanocrystalline diamond powder suspension to the substrate 108.

In step 114, PEI is applied onto the substrate 108 using a process known as spin coating. In step 116, the suspension of nanocrystalline diamond powder containing PEI is seeded onto the substrate 108 using spin coating.

The spin coating steps 114 and 116 may use a conventional spin coater capable of speeds up to 6000 rpm in both directions and performing up to 51 steps. Spin coating of PEI onto the substrate in step 114 may be done, for instance by operating a spin coater at 1000 rpm for approximately 1.5 min at an acceleration value (ACL) of 15 followed by operating the spin coater at 3000 rpm for 40 seconds at an ACL of 15. In step 116, the substrate 108 treated with PEI is spin coated with the nanocrystalline diamond powder suspension containing PEI to seed the surface of the substrate 108 with diamond powder. Spin coating with nanocrystalline diamond powder suspension containing PEI in step 116 may be done, for instance, by operating the spin coater at a spin speed between 1000 rpm to 6000 rpm and ACL values of 7 to 250. Generally, in step 116 spin coater speed will be between approximately 2500 rpm and approximately 3500 rpm with ACL values of between 75 to 125 for a single step period of approximately 1.5 minutes. In an exemplary embodiment, in step 116 the target speed for the spin coater will be approximately 3000 rpm with an ACL of 100. The exemplary suspension of nanocrystalline diamond powder contained about 20 mg/ml of nanocrystalline diamond powder.

After seeding of the substrate 108 with the nanocrystalline diamond powder in step 116, diamond deposition is carried out in step 118. In some embodiments, the diamond deposition step 118 may be performed using chemical vapor deposition (CVD). In some embodiments, the diamond deposition step 118 may be performed using Microwave plasma chemical vapor deposition (MPCVD). Prior to carrying out the diamond deposition step 118, the seeded surface of the substrate 108 may be plasma etched to remove any non-diamond carbon from the seeded surface. The plasma etching may be $H_2$, $CF_4$, or $O_2$, for instance. By way of illustration, and not by way of limitation, the seeded substrate may be $H_2$ plasma etched under conditions of substantially 30-50 torr pressure, at 500 W to 700 W, for a time period of 5 to 15 minutes. In one exemplary embodiment, the seeded substrate may be $H_2$ plasma etched under conditions of substantially 30 torr pressure, at 600 W, for a period of 10 minutes.

In the diamond deposition step 118, the substrate 108 may be placed on a stage (not shown) or other support within a CVD reactor (not shown) which includes an inductive heater. A mixture of argon, hydrogen, and methane may be passed into the CVD reactor in a ratio of between 40-70 parts argon, to between 29-59 parts hydrogen, to 1 part methane. In one exemplary embodiment, the mixture of argon, hydrogen, and methane may be passed into the CVD reactor in a ratio of substantially 60:39:1. The CVD reactor may be operated at a temperature between 400° C. and 850° C. during the flow of the gases through the CVD reactor while maintaining a reactor pressure of between 50 torr to 80 torr and a power setting between 1000 W and 1150 W. Flow of the gases continues for between 60 minutes to 300 minutes to deposit the TFND on the previously seeded surface of the substrate 108. Time necessary to complete the deposition of the TFND on the seeded substrate 108 will vary depending upon the deposition temperature and required film thickness. In general, longer periods of time will improve growth of the TFND; however, to maintain the desired thickness of the TFND of less than 1 µm, reaction times will generally be restricted to less than 300 minutes.

In step 120, the TFND deposited on the substrate 108 may be analyzed using optical microscopy, a scanning electron microscope (SEM), Energy Dispersive X-Ray Spectroscopy (EDS) which may be used in conjunction with SEM, and/or Raman Spectroscopy, for instance.

Referring now to FIG. 2, shown therein is a table 200 which summarizes measured values of particle size and zeta potential for two nanocrystalline diamond samples 202 and 204 subjected to the purification and deaggregation process described above with respect to step 102 of FIG. 1 of a first air oxidation step, followed by a graphitization step, followed by a second air oxidation step. During the first air oxidation step of the first sample 202 shown in row 210, an average aggregate size was reduced from 1912 nm to 290.47 nm. Upon performing the graphitization step shown in row 212, the average aggregate size increased to 1343.3 nm. Following the second air oxidation step shown in row 214, the aggregate size was reduced to 269.03 nm. As shown in row 214, an additional benefit of the second air oxidation step is the nanocrystalline diamond zeta potential is −53.57. During the first air oxidation step of the second sample 204 shown in row 216, an average aggregate size was reduced from 895.2 nm to 389.4 nm. After performing the graphitization step shown in row 218, the average aggregate size increased to 1778.7 nm. Following the second air oxidation step shown in row 220, the aggregate size was reduced to 313.4 nm. As shown in row 220, the nanocrystalline diamond zeta potential is −53.57 after the second air oxidation step. It should be noted that the aggregate size and zeta potential were determined prior to preparing a slurry of the particles in water and sonication. Following preparation of the slurry and sonication, final particle size was consistently in the range of about 120 nm to 150 nm.

While specific measured results have been shown with respect to FIG. 2, it should be noted that, in general, untreated nanocrystalline diamond may have an average aggregate particle size of between 0.8 μm and 2 μm. After the first air oxidation step, the average aggregate size may be reduced to a range between 0.25 μm and 0.5 μm. After the graphitization step, the average aggregate particle size may be increased to between 1.2 μm and 1.8 μm. After the second air oxidation step, the nanocrystalline diamond zeta potential may be in a range from approximately −45 to approximately −55.

Figure 3B:
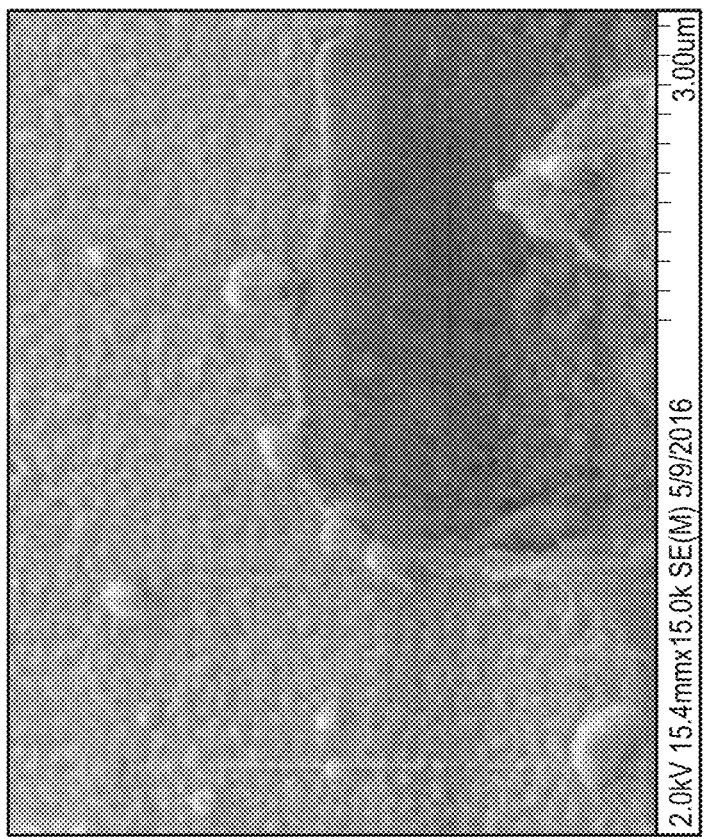
FIGS. 3A-3B show scanning electron microscope images of seeded nanocrystalline diamond powder on a substrate where the nanocrystalline diamond powder in image a had been sonicated for 10 minutes and the nanocrystalline diamond powder in image b had been sonicated for 45 minutes.
Figure 3A:
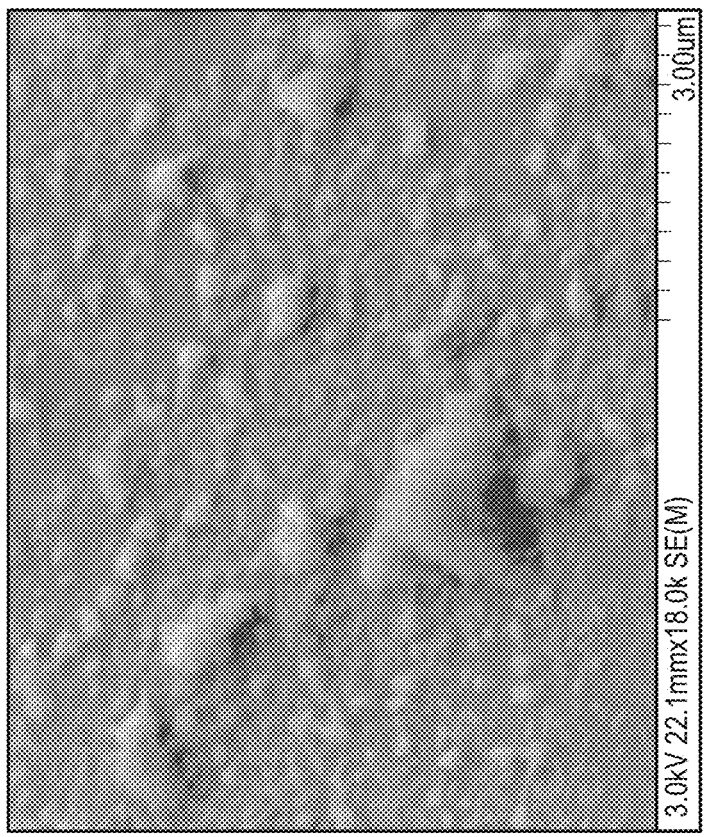
Figure 5A:
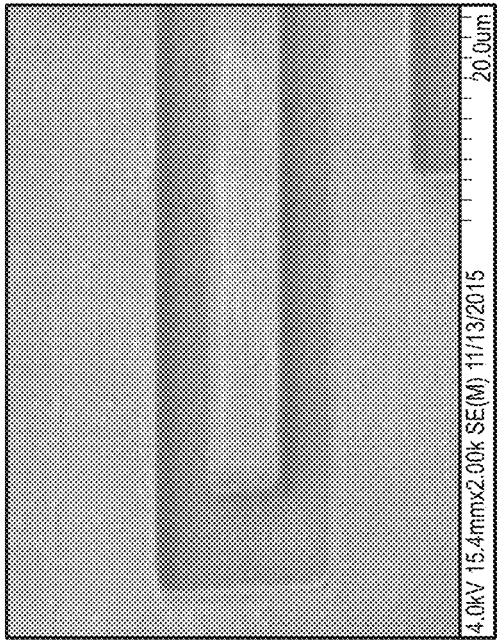
FIGS. 5A-5D show scanning electron microscope images FIG. 5A, FIG. 5B, FIG. 5C, and FIG. 5D of 6 nm nanocrystalline diamond powder seeded on a substrate using deionized water as a suspending solvent depicted at varying magnifications.
Figure 5B:
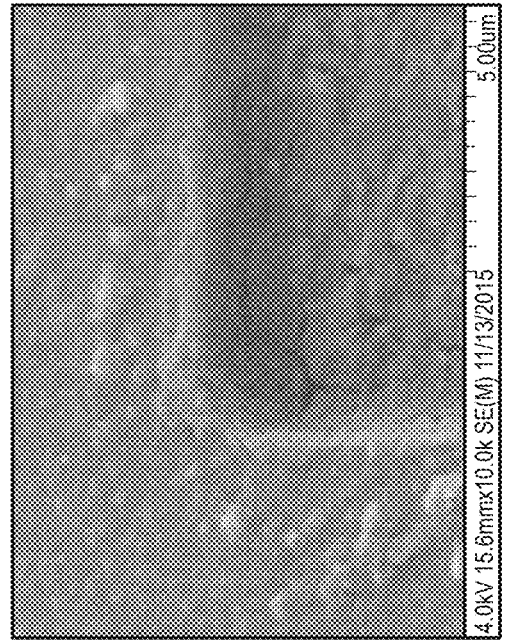
Figure 5C:
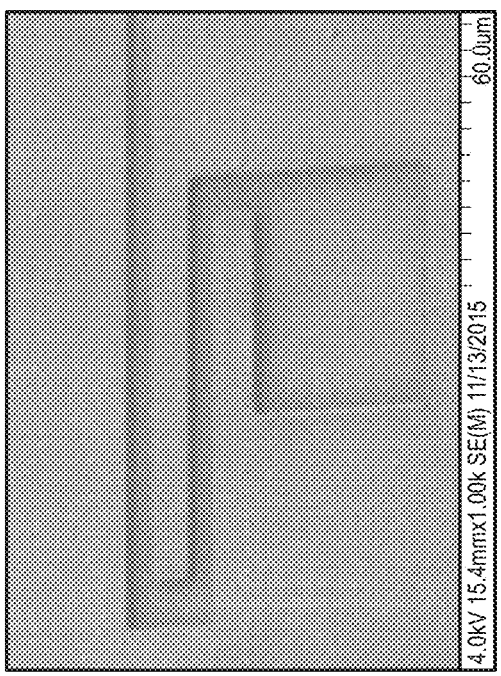
Figure 5D:
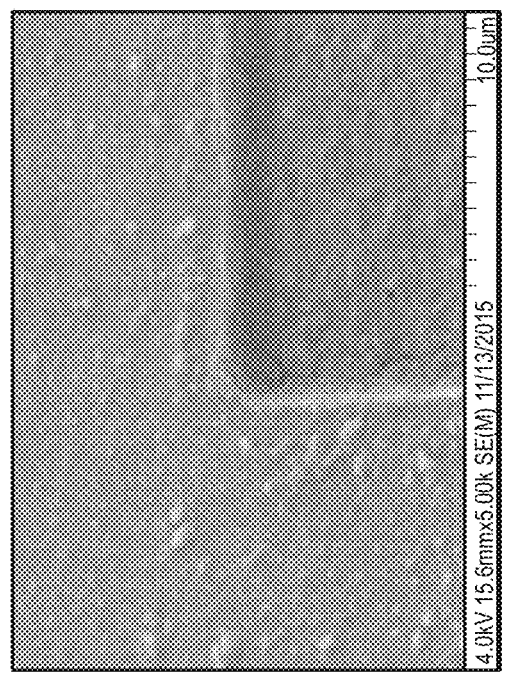
Figure 6A:
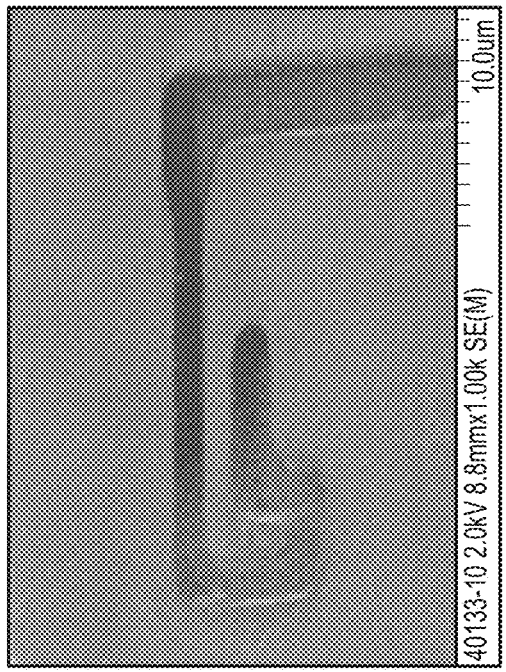
FIGS. 6A-6D show scanning electron microscope images FIG. 6A, FIG. 6B, FIG. 6C, and FIG. 6D of 6 nm nanocrystalline diamond powder seeded on a substrate using NaOH as a suspending solvent depicted at varying magnifications.
Figure 6B:
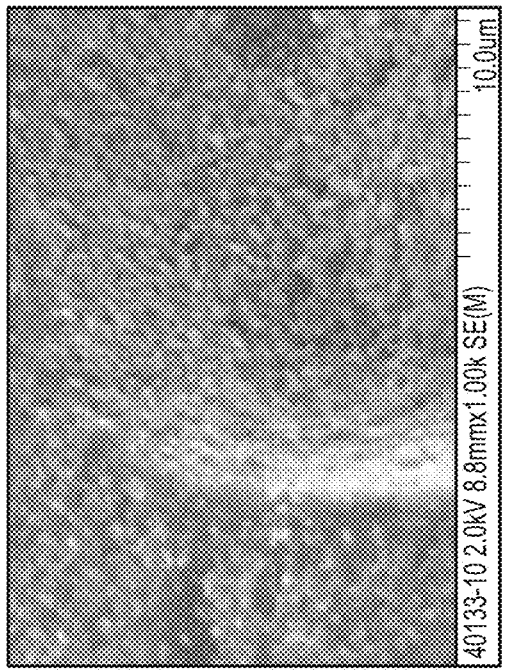
Figure 6C:
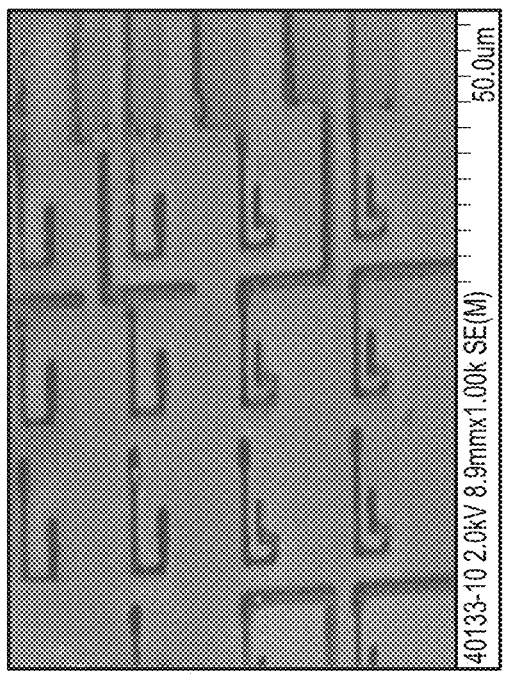
Figure 6D:
Figure 7:
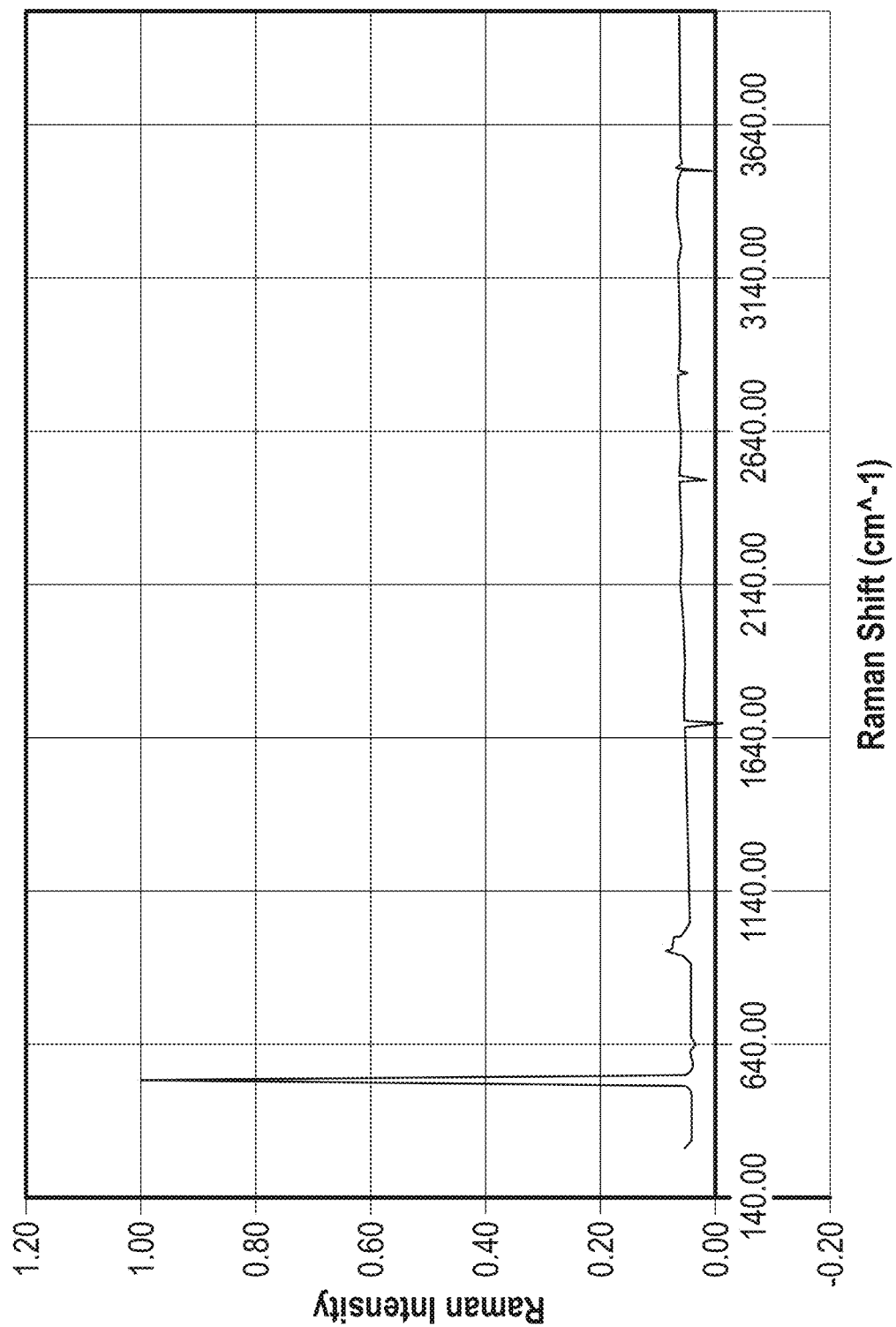
FIG. 7 is a line graph that illustrates Raman Spectroscopy of a 25 nm nanocrystalline diamond powder seeded on a substrate.
Figure 8:
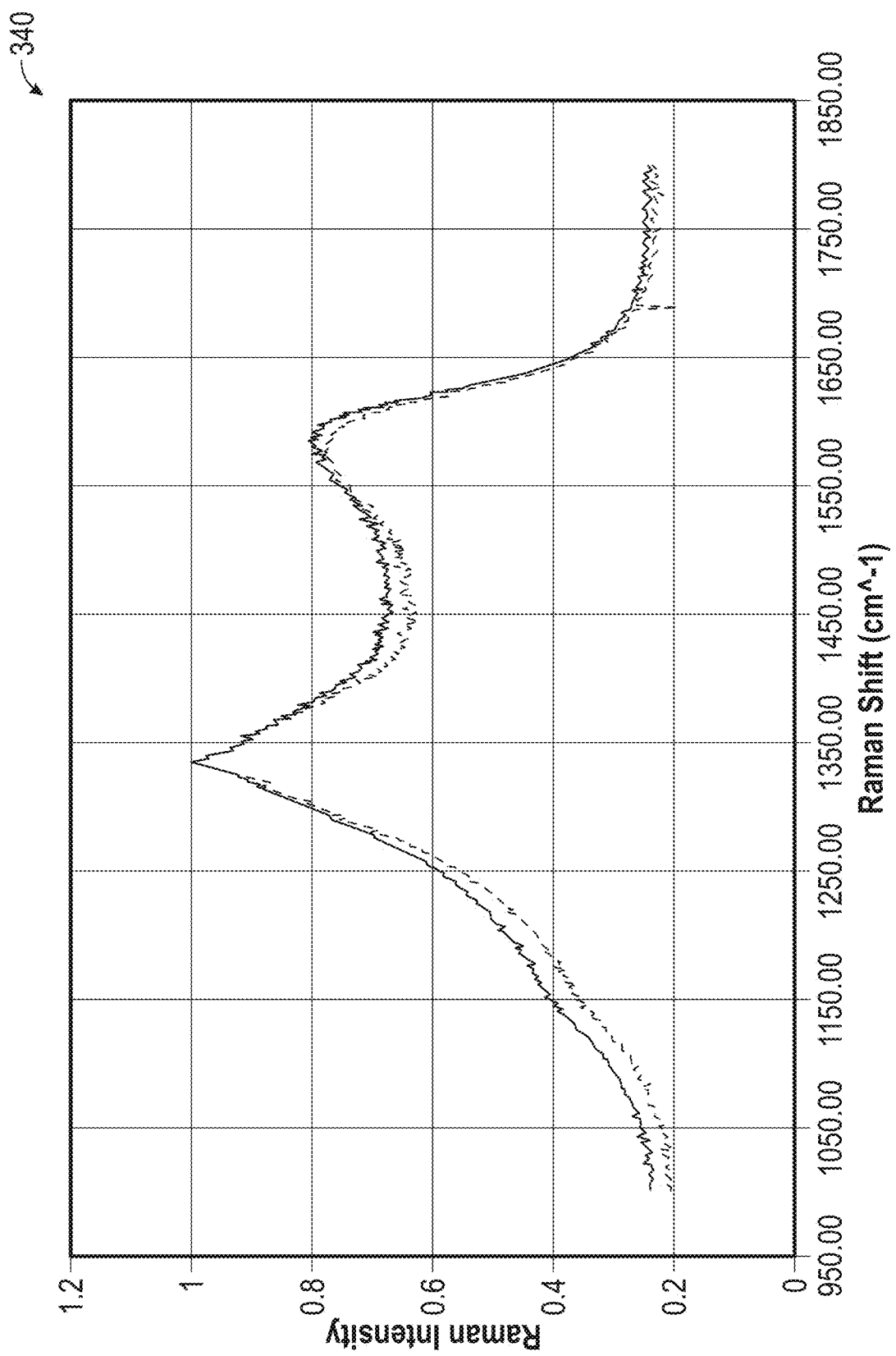
FIG. 8 is a line graph that illustrates Raman Spectroscopy of a thin film nanocrystalline diamond grown on 25 nm nanocrystalline diamond powder seeded on a substrate.
Figure 9:
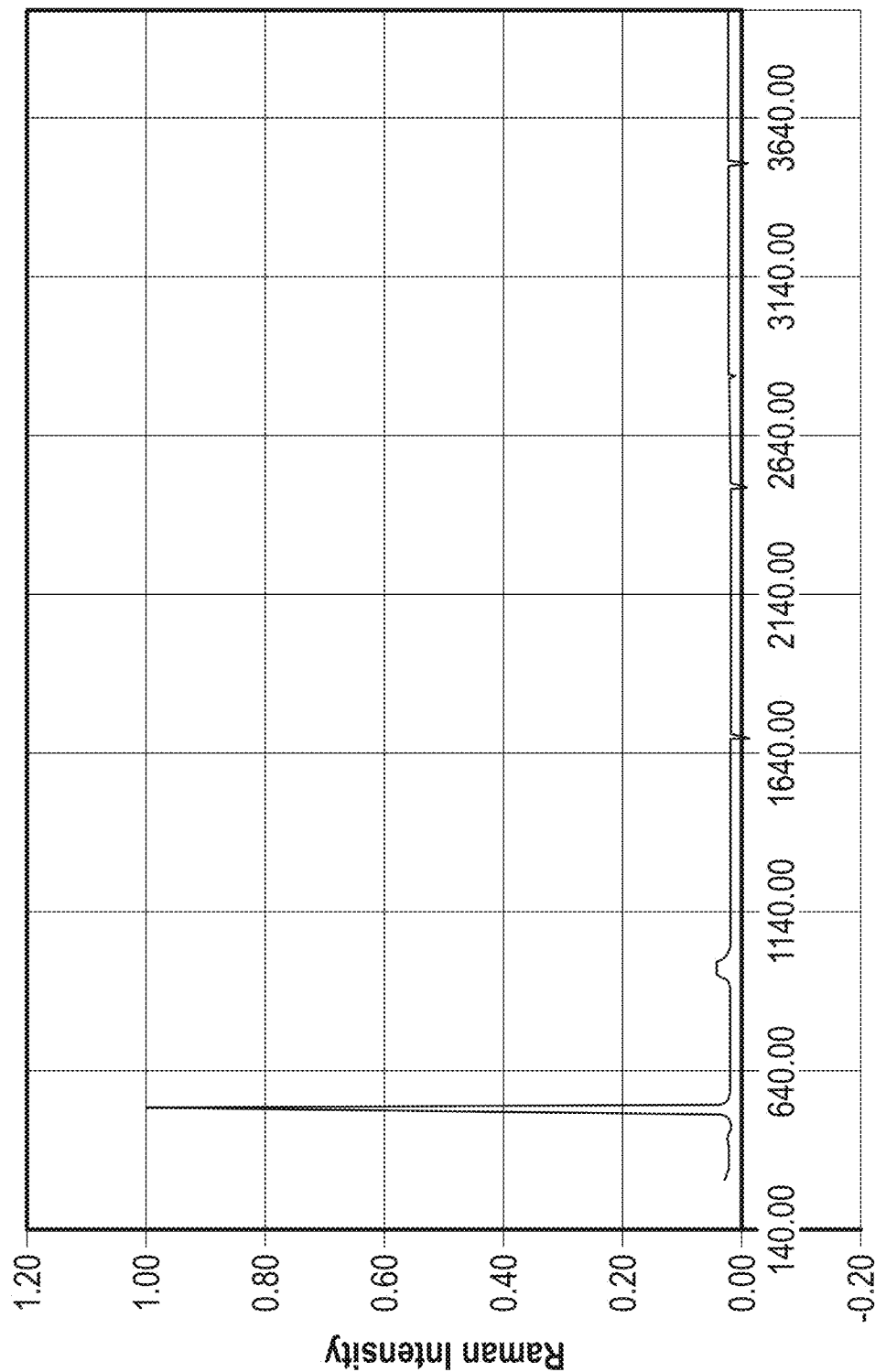
FIG. 9 is a line graph that illustrates Raman Spectroscopy of a 6 nm nanocrystalline diamond powder seeded on a substrate.
Figure 10:
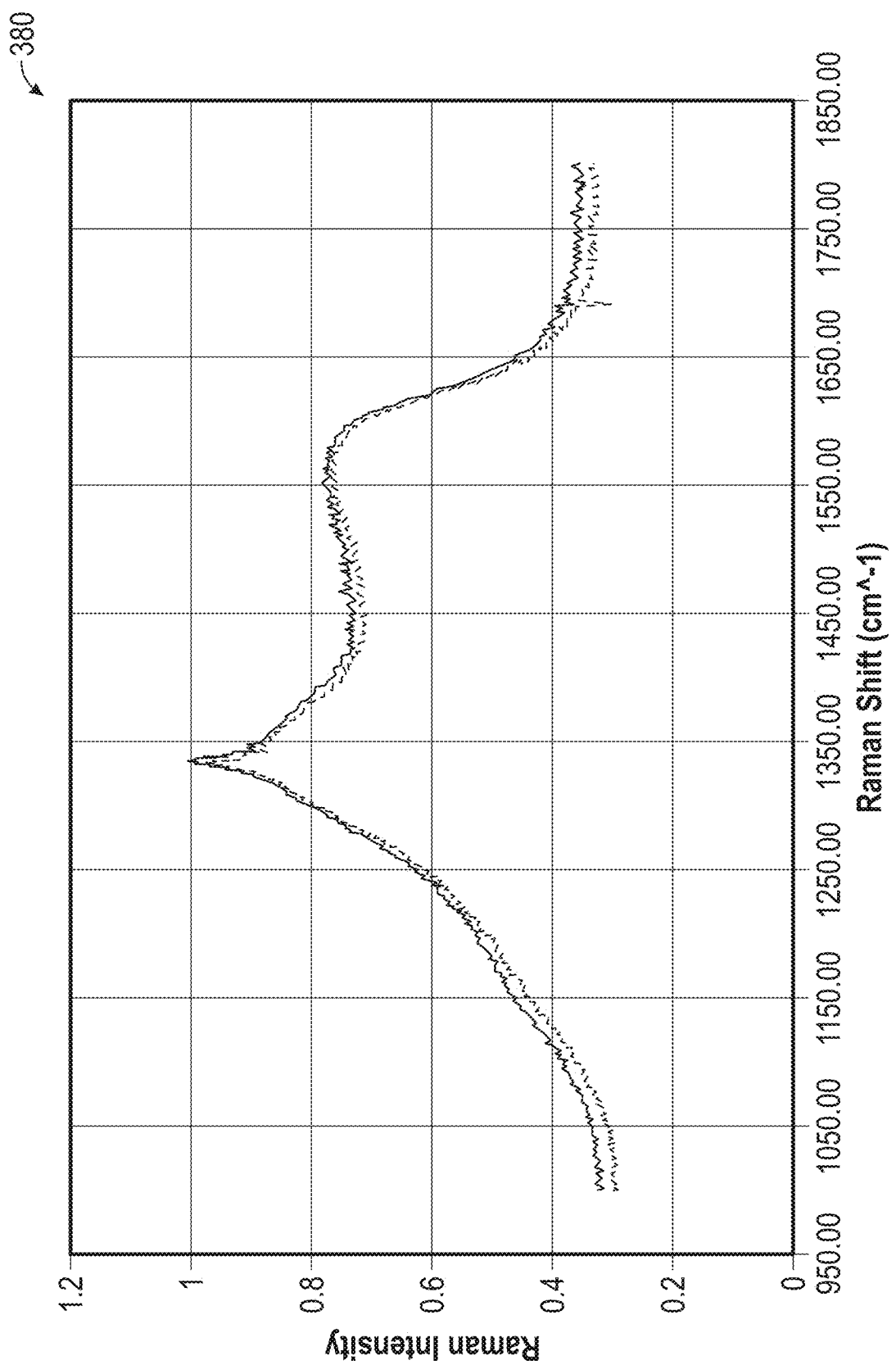
FIG. 10 is a line graph that illustrates Raman Spectroscopy of a thin film nanocrystalline diamond grown on 6 nm nanocrystalline diamond powder seeded on a substrate.
Figure 11B:
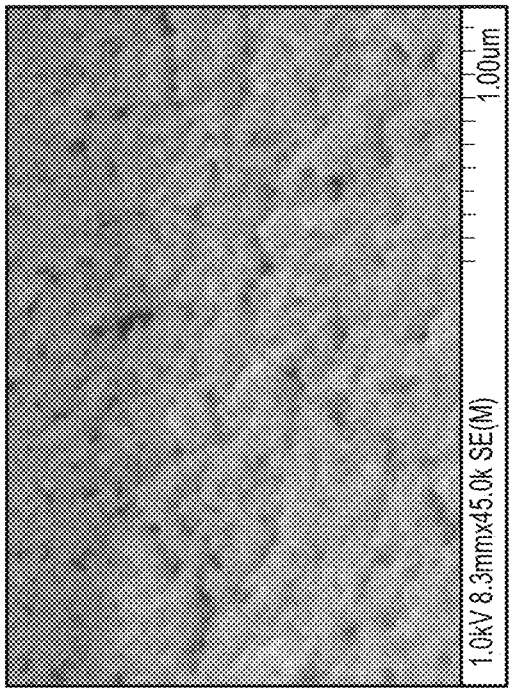
FIGS. 11A-11D shows scanning electron microscope images FIG. 11A, FIG. 11B, FIG. 11C, and FIG. 11D of a thin film nanocrystalline diamond grown on 25 nm nanocrystalline diamond powder seeded on a substrate where images
Figure 11D:
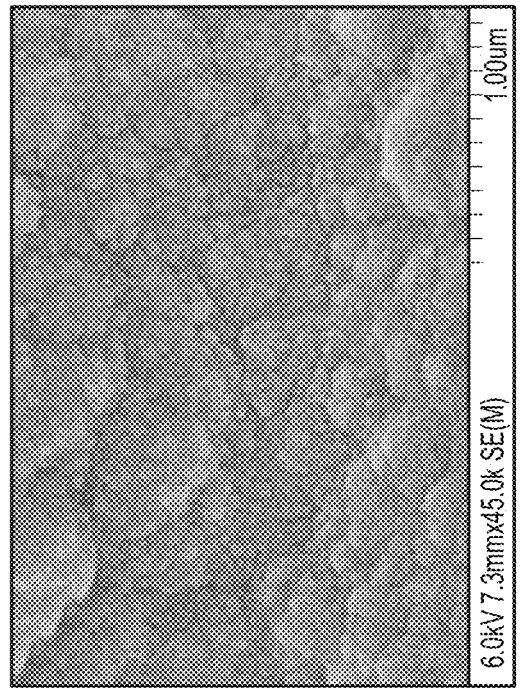
Figure 11A:
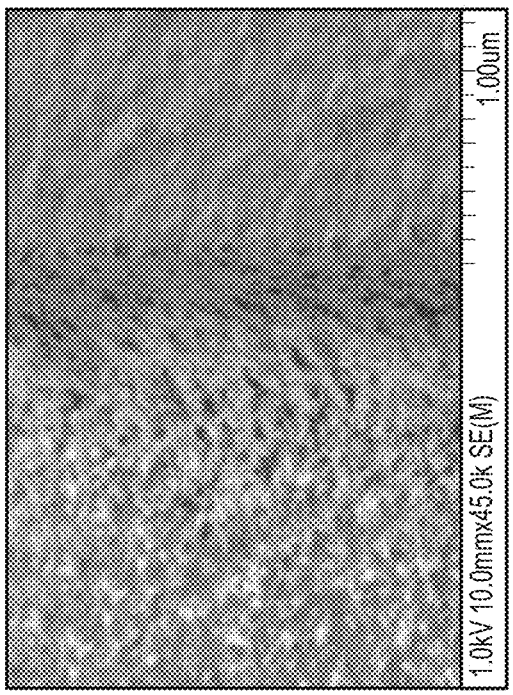
Figure 11C:
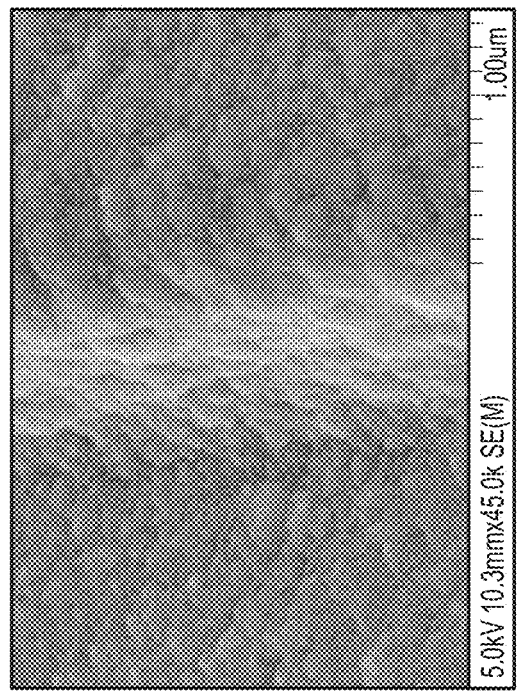
Figure 12B:
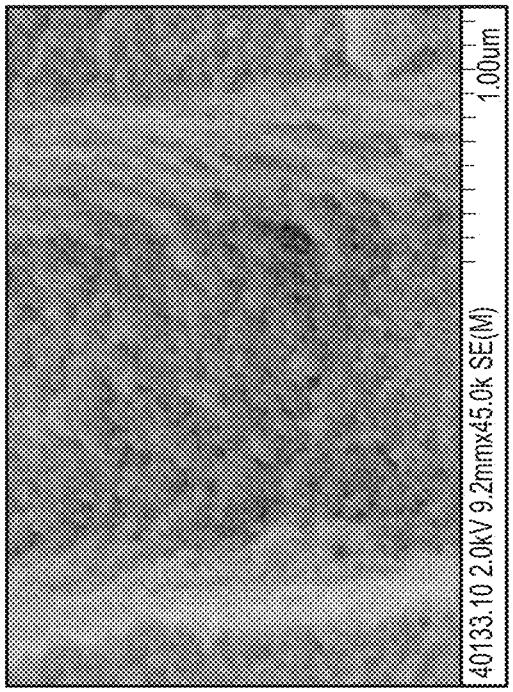
FIGS. 12A-12D show scanning electron microscope images FIG. 12A, FIG. 12B, FIG. 12C, and FIG. 12D of a thin film nanocrystalline diamond grown on 6 nm nanocrystalline diamond powder seeded on a substrate where images
Figure 12D:
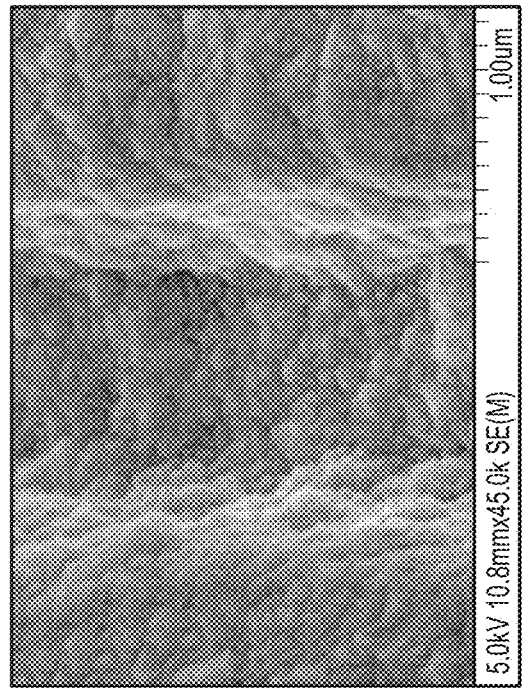
Figure 12A:
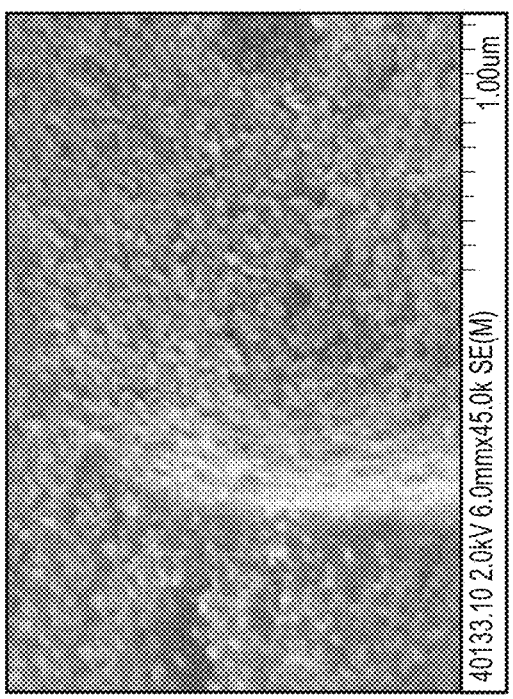
Figure 12C:
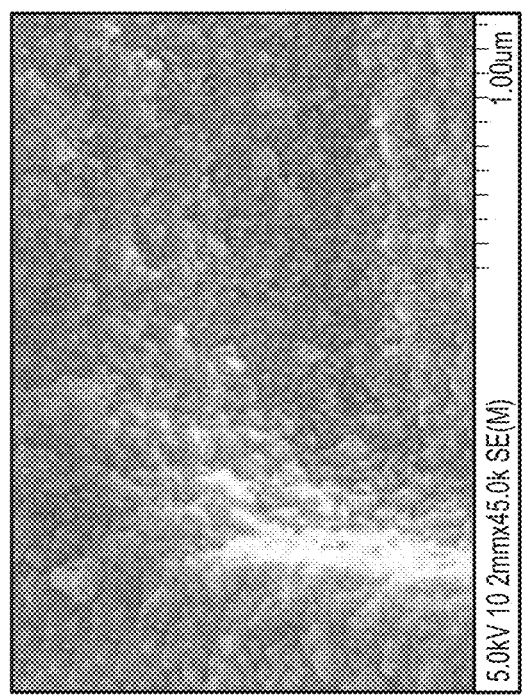

The sonication step 106 in preparation of the nanocrystalline diamond slurry provides improved uniformity and coverage during the seeding process in step 116. Optimized sonication parameters can be determined for each suspension of nanocrystalline diamond powder in solvent by observing factors such as particle size and deagglomerated aggregate. In the case of the example discussed above, the optimum conditions were determined to be a sonication setting of 70% power, 10 seconds "on" time followed by 5 seconds "off" time and total sonication time of 60 minutes. As reflected by the scanning electron microscope (SEM) images of FIGS. 3A and 3B, increasing the sonication time period from 10 minutes FIG. 3A to 45 minutes FIG. 3B improves the uniformity of seeding. The nanocrystalline diamond powder of the images in FIGS. 3A and 3B was suspended in water.

Solvent selection impacts average particle size and zeta potential. In particular, pH of the solvent will impact average particle size and zeta potential. In FIG. 4, a table 300 shows illustrative zeta values and average particle size for a range of pH values where sodium hydroxide (NaOH) was used as a suspending solvent. Use of NaOH solvent prevents reaggregation of the nanocrystalline diamond slurry and provides for more uniform seeding of the nanocrystalline diamond powder on the surface of the substrate 108, as illustrated in the table 300 of FIG. 4.

To further illustrate how solvent selection impacts average particle size, FIGS. 5A-5D show SEM images illustrating various magnification levels of a 6 nm nanocrystalline diamond powder seeded on a substrate using deionized water as a suspending solvent. The SEM images of FIGS. 5A-5D can be compared with SEM images of FIGS. 6A-6D which depict 6 nm nanocrystalline diamond powder seeded on a substrate using NaOH as a suspending solvent. A person of skill in the art will recognize that the average particle size of the nanocrystalline diamond powder seeded on the substrate using NaOH as the suspending solvent illustrated in FIGS. 6A-6D are smaller and more consistent when compared to the nanocrystalline diamond powder seeded on the substrate using deionized water as the suspending solvent illustrated in FIGS. 5A-5D.

To demonstrate the benefits of using a nanocrystalline diamond powder having a smaller particle size during the seeding process, comparisons were made between 6 nm nanocrystalline diamond powder and 25 nm nanocrystalline diamond powder. The 6 nm nanocrystalline diamond powder was treated using the purification and deaggregation process described above. The 25 nm nanocrystalline diamond powder suspension was commercially obtained and not treated. Suspensions of 6 nm nanocrystalline diamond powder and 25 nm nanocrystalline diamond powder were prepared and seeded on substrates and placed in a CVD reactor operating at a temperature of approximately 850° C. with a pressure of approximately 60 torr to grow thin film nanocrystalline diamond. Observation of Raman Spectroscopy of the thin film nanocrystalline diamond grown on 25 nm nanocrystalline diamond powder (illustrated in line graph 340 in FIG. 8), and 6 nm nanocrystalline diamond powder (illustrated in line graph 380 of FIG. 10) demonstrate that both samples grew diamond from nucleation as evidenced by the peaks at 1330 cm$^{-1}$. However, upon comparison of the morphology depicted in the SEM images of FIGS. 11A-11D of the 25 nm nanocrystalline diamond powder to the morphology depicted in the SEM images of FIGS. 12A-12D of the 6 nm nanocrystalline diamond powder, a person of skill in the art will recognize that the smaller 6 nm nanocrystalline diamond powder provides both faster and smoother growth of the TFND.

Figure 13A:
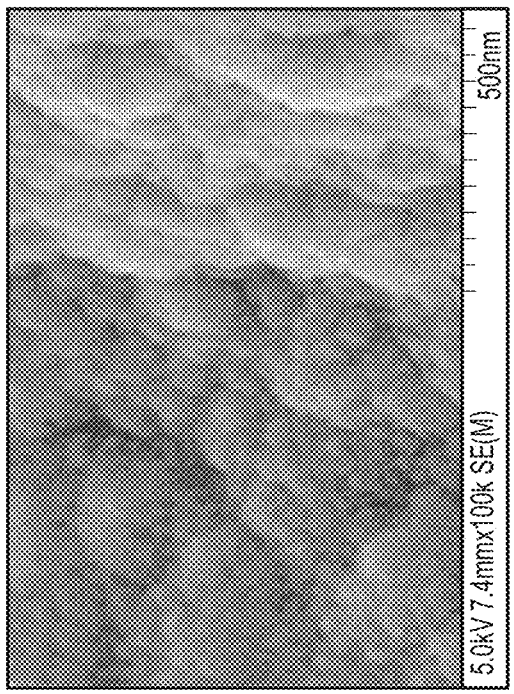
FIGS. 13A-13D show scanning electron microscope images FIG. 13A, FIG. 13B, FIG. 13C, and FIG. 13D of a thin film nanocrystalline diamond grown on 6 nm nanocrystalline diamond powder seeded on a substrate where the thin film nanocrystalline diamond in images FIG. 13A and FIG. 13B were grown at a temperature of 550° C. and images FIG. 13C and FIG. 13D were grown at a temperature of 850° C.
Figure 13B:
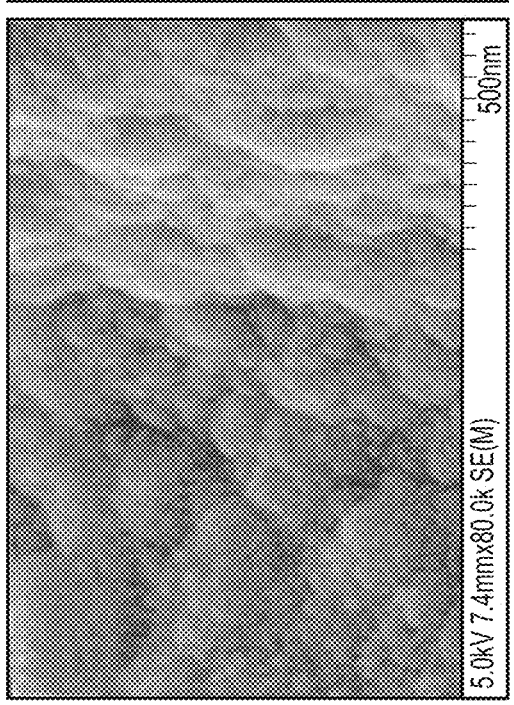
Figure 13C:
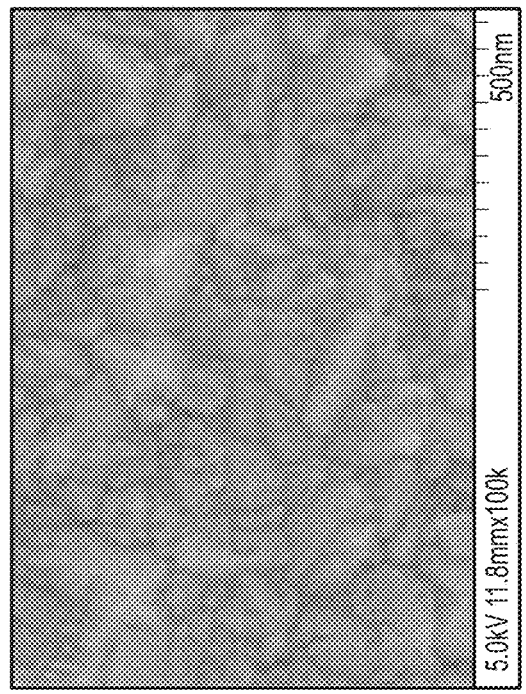
Figure 13D:
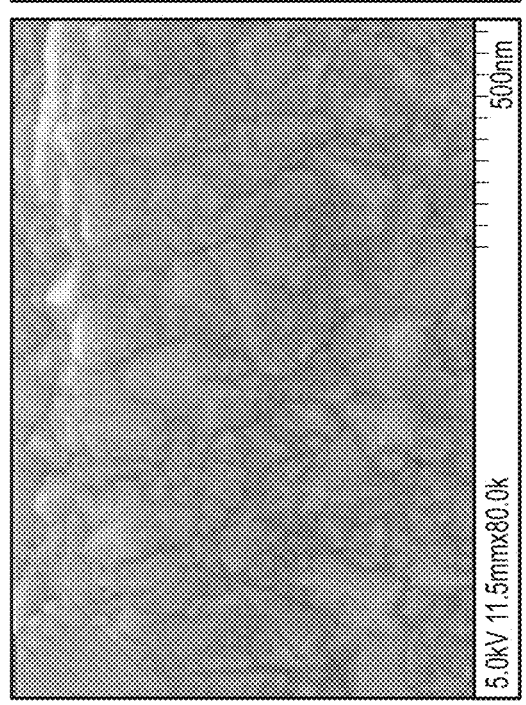
Figure 14:
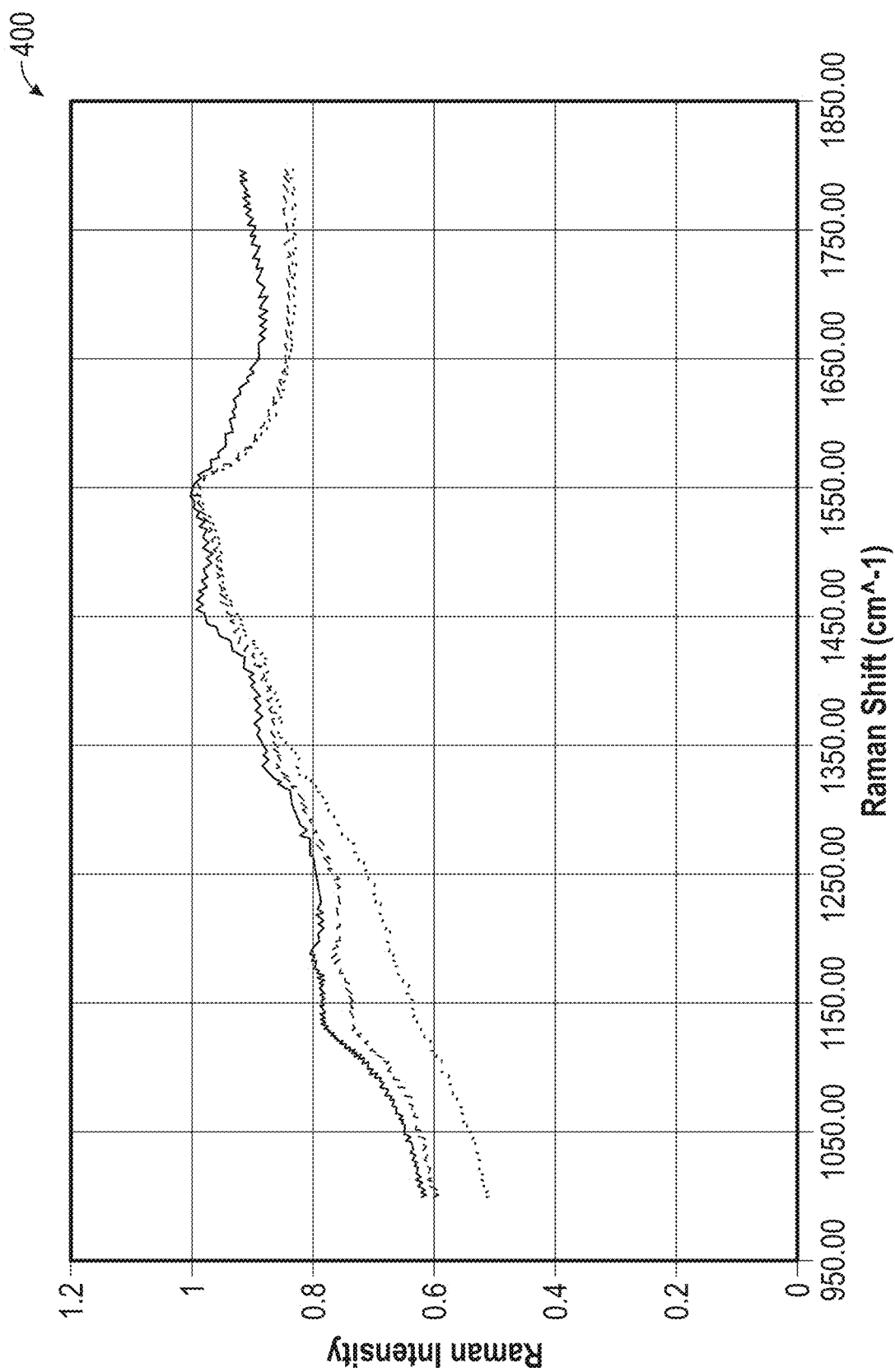
FIG. 14 is a line graph that illustrates Raman Spectroscopy of a thin film nanocrystalline diamond grown on 6 nm nanocrystalline diamond powder seeded on a substrate and deposited at a temperature of 550° C.
Figure 15:
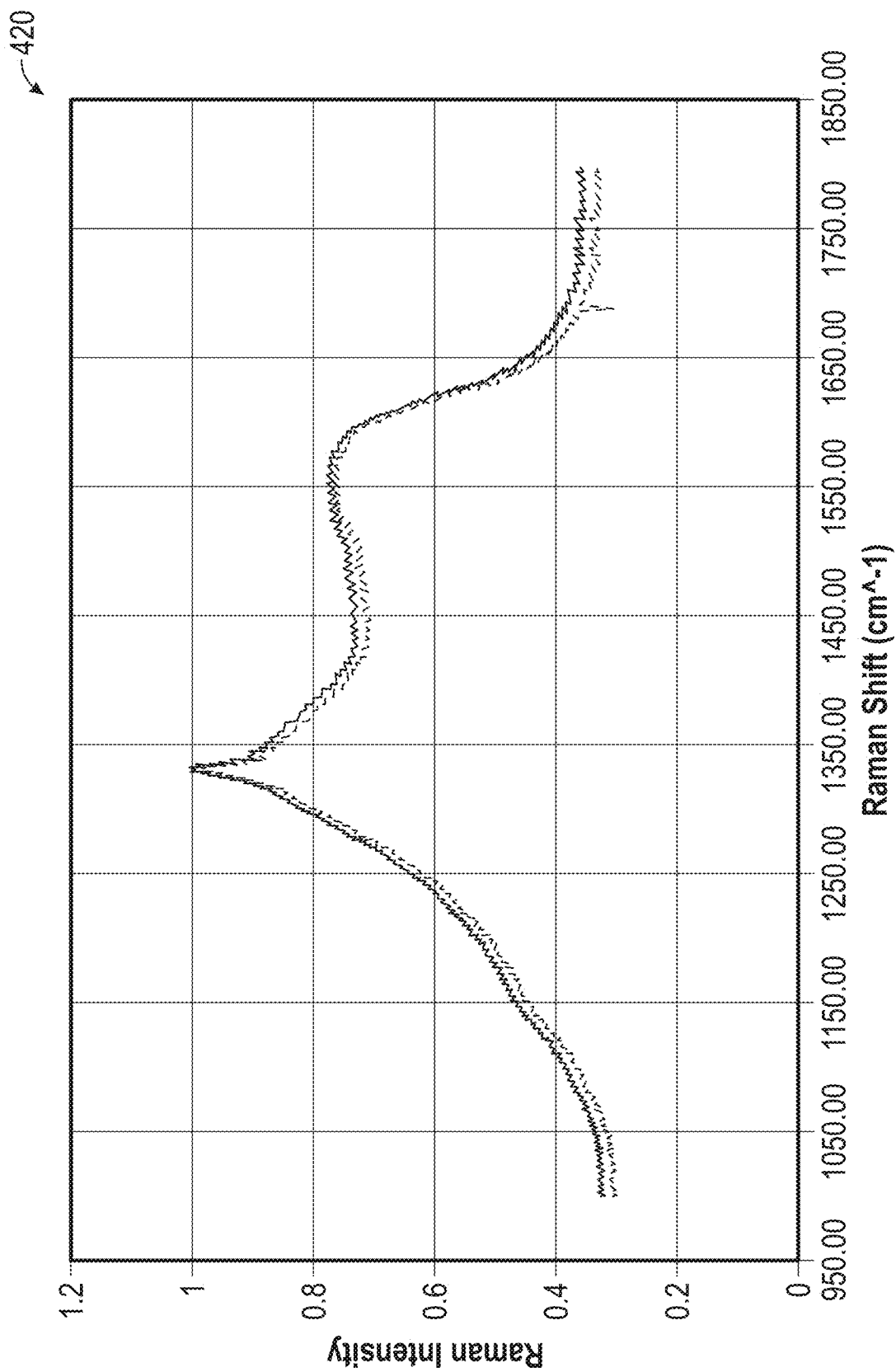
FIG. 15 is a line graph that illustrates Raman Spectroscopy of a thin film nanocrystalline diamond grown on 6 nm nanocrystalline diamond powder seeded on a substrate and deposited at a temperature of 850° C.

Preferably, the MPCVD step 118 may take place at temperatures as high as practical for the CVD reactor. While TFND can be achieved at temperatures as low as 400° C., higher temperatures tend to produce TFND having greater uniformity across the surface of the substrate. FIGS. 13A-13D show SEM images of TFND deposited on a surface seeded with 6 nm nanocrystalline diamond powder heated at temperatures of 550° C. and 850° C. Comparison of the images in FIGS. 13A and 13B of the 6 nm nanocrystalline diamond powder deposited while heated at 550° C. to images in FIGS. 13C and 13D of 6 nm nanocrystalline diamond powder deposited while heated at 850° C., a person of skill in the art will recognize that deposition at higher temperatures results in a smoother, more uniform surface and higher quality diamond. A Raman spectroscopy line graph 400 of the 6 nm nanocrystalline diamond powder deposited while heated at 550° C. depicted in FIG. 14 and a Raman spectroscopy line graph 420 of the 6 nm nanocrystalline diamond powder deposited while heated at 850° C. depicted in FIG. 15 also demonstrates the benefits of operating at higher temperatures. As depicted in FIGS. 13A, 13B, and 15, operating at higher temperatures, e.g., 700° C. to 850° C. provides the ability to deposit TFND at thicknesses of less than 1 μm on wide-bandgap semiconducting devices. However, an upper temperature limit for deposition conditions will be determined by the nature of the substrate to be treated and its ability to withstand the temperature conditions. Lower temperatures may be dictated if the substrate will be damaged at higher temperatures.

Figure 16:
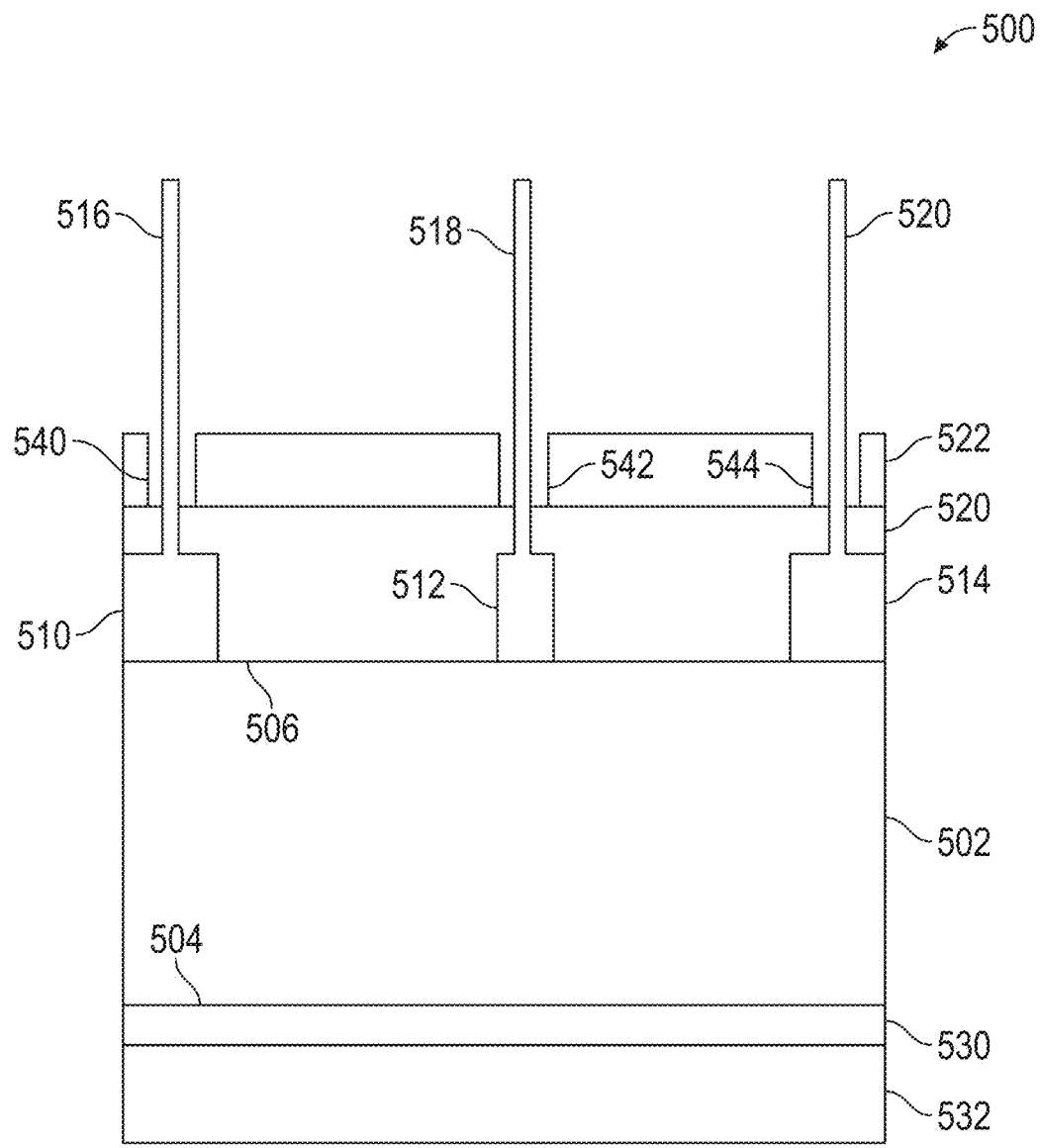
FIG. 16 is a schematic side elevation of an electronic device having thin film nanocrystalline diamond thermal interface material layers bonded to integrated heat spreaders in accordance with the principles of the present invention.

Referring now to FIG. 16, shown therein is a high-bandgap semiconductor electronic device 500. The electronic device 500 is shown including a transistor 502 for the purposes of illustrating the inventive concepts disclosed herein. However, it should be noted that the electronic device 500 may be constructed using any high-bandgap semiconductor device such as Schottky diodes, rectifiers, JFETs, MOSFETs, BJTs, LEDs, HEMT and thyristors, for instance, that may benefit from increased heat transport provided by the inventive concepts disclosed herein. The transistor 502 may have a substrate end 504 and a device interface end 506, the device interface end 506 having metalized integrated device structures such as a source 510 ohmic contact, a gate 512 Schottky contact, and a drain 514 ohmic contact. The source 510 ohmic contact, gate 512 Schottky contact, and drain 514 ohmic contact may be provided with electrical conductors 516, 518, and 520, respectively, bonded to the source 510 ohmic contact, gate 512 Schottky contact, and drain 514 ohmic contact. The electrical conductors 516, 518, and 520 are designed to connect the electronic device 500 to another device (not shown) as is known in the art.

To draw heat away from the transistor 502 during operation, the electronic device 500 may be provided with a thermal interface material layer 520 deposited on the device interface end 506 and bonded to a first integrated heat spreader 522 and a second thermal interface material layer 530 deposited on the substrate end 502 and bonded to a second integrated heat spreader 532. The first and second thermal interface layers 520 and 530 may be thin film nanocrystalline diamond layers formed as described above. The first and second integrated heat spreaders 522 and 532 may be constructed of materials having high thermal conductivity such as copper or diamond, for instance.

To allow connection of the electronic device 500 to another device, vias 540, 542, and 544 may be formed passing through the first integrated heat spreader 522. Vias 540, 542, and 544 may be formed using techniques known in the art.

While the electronic device 500 is shown having the first thermal interface material layer 520 deposited on the device interface end 506 and bonded to the first integrated heat spreader 522 and the second thermal interface material layer 530 deposited on the substrate end 504 and bonded to the second integrated heat spreader 532, it should be noted that in some embodiments (not shown), the electronic device 500 may be provided having only the first thermal interface material layer 520 deposited on the device interface end 506 and bonded to the first integrated heat spreader 522, or, only the second thermal interface material layer 530 deposited on the substrate end 504 and bonded to the second integrated heat spreader 532.

It should be noted that the term integrated device structures as used herein means any fabricated devices or structures of an electronic device.

From the above description, it is clear that the inventive concept(s) disclosed herein are well adapted to carry out the objects and to attain the advantages mentioned herein, as well as those inherent in the inventive concept(s) disclosed herein. While the embodiments of the inventive concept(s) disclosed herein have been described for purposes of this disclosure, it will be understood that numerous changes may be made and readily suggested to those skilled in the art which are accomplished within the scope and spirit of the inventive concept(s) disclosed herein.

What is claimed is:

1. A method of forming a thermal interface material layer, comprising:
    adding polyethyleneimine (PEI) to a nanocrystalline diamond powder suspension to produce a PEI-containing nanocrystalline diamond powder suspension;
    sonicating the PEI-containing nanocrystalline diamond powder suspension to form a sonicated nanocrystalline diamond powder suspension;
    seeding the sonicated nanocrystalline diamond powder suspension on a surface of a semiconductor device mounted on a substrate to produce a seeded substrate; and
    growing a thin film of nanocrystalline diamond on the surface of the seeded substrate in a chemical vapor deposition (CVD) reactor by flowing a gas stream comprising argon, hydrogen, and methane into the CVD reactor operating at a predetermined temperature, at a predetermined pressure, and at a predetermined power level.

2. The method of claim 1, wherein PEI is spin coated on the surface of the substrate prior to the sonicated nanocrystalline diamond powder suspension being seeded on the surface of the substrate.

3. The method of claim 2, wherein the PEI is spin coated on the surface of the substrate by operating a spin coater at substantially 1000 rpm for substantially one and a half (1.5) minutes followed by operating the spin coater at substantially 3000 rpm for substantially forty seconds at an acceleration value of 15.

4. The method of claim 1, wherein the seeded substrate is plasma etched prior to growing the thin film of nanocrystalline diamond on the surface of the seeded substrate.

5. The method of claim 4, wherein the plasma etching is $H_2$ plasma etching performed under a predetermined pressure at a predetermined power for a predetermined time.

6. The method of claim 5, wherein the predetermined pressure is substantially thirty torr, the predetermined power is substantially six hundred watts, and the predetermined time is substantially ten minutes.

7. The method of claim 1, wherein the flowing gas stream is comprised of argon, hydrogen, and methane combined in a ratio of approximately sixty percent argon, thirty nine percent hydrogen, and one percent methane.

8. The method of claim 1, wherein the predetermined temperature of the CVD reactor is between 400° C. and 850° C.

9. The method of claim 1, wherein the predetermined pressure of the CVD reactor is between 50 torr and 80 torr.

10. A method of forming a thermal interface material layer, comprising:
    seeding a nanocrystalline diamond powder suspension on a surface of a semiconductor device mounted on a substrate to produce a seeded substrate; and
    growing a thin film of nanocrystalline diamond on the surface of the seeded substrate in a chemical vapor deposition (CVD) reactor by flowing a gas stream comprising argon, hydrogen, and methane into the CVD reactor operating at a predetermined temperature, at a predetermined pressure, and at a predetermined power level between 1000 watts and 1150 watts.

11. The method of claim 10, wherein seeding the nanocrystalline diamond powder suspension on the surface of the substrate is defined further as seeding the nanocrystalline diamond powder suspension of the surface of the substrate.

12. The method of claim 10, wherein the nanocrystalline diamond powder suspension includes a nanocrystalline diamond powder having a particle size of 6 nm or less.

13. The method of claim 10, wherein the nanocrystalline diamond powder suspension is sonicated with a sonicator having an output frequency of between 5 kHz and 30 KHz and a maximum output voltage of between 50 Vrms to 80 Vrms.

14. A method of producing a thermal interface material layer on an electronic device, comprising:
    purifying a nanocrystalline diamond powder by heating the nanocrystalline diamond powder in a furnace at a temperature between 450° C. and 600° C. for a period of time between four hours and six hours to produce a purified nanocrystalline diamond powder;
    graphitizing the purified nanocrystalline diamond powder by heating the purified nanocrystalline diamond powder in the furnace at a temperature between 700° C. and 950° C. for a period of time between thirty minutes and ninety minutes to produce a graphitized nanocrystalline diamond powder;
    deaggregating the graphitized nanocrystalline diamond powder by heating the graphitized nanocrystalline diamond powder in the furnace at a temperature between 450° C. and 600° C. for a period of time between four hours and six hours to produce a deaggregated nanocrystalline diamond powder;

suspending the deaggregated nanocrystalline diamond powder in a solvent to produce a nanocrystalline diamond powder suspension;

sonicating the nanocrystalline diamond powder suspension to produce a sonicated nanocrystalline diamond powder suspension;

seeding the sonicated nanocrystalline diamond powder suspension on a surface of a device interface end of an electronic device by spin coating to produce a seeded surface; and growing a thin film of nanocrystalline diamond on the seeded surface of the electronic device in a chemical vapor deposition (CVD) reactor by flowing a gas stream comprising argon, hydrogen, and methane into the CVD reactor operating at a predetermined temperature, a predetermined pressure, and at a predetermined power level, the thin film of nanocrystalline diamond forming the thermal interface material layer.

15. The method of producing a thermal interface material layer on an electronic device of claim 14, further comprising bonding an integrated heat spreader to the thermal interface material layer of the electronic device.

16. The method of producing a thermal interface material layer on an electronic device of claim 15, wherein the integrated heat spreader is constructed of a material comprising one of copper and diamond.

17. The method of producing a thermal interface material layer on an electronic device of claim 14, wherein polyethyleneimine (PEI) is added to the nanocrystalline diamond powder suspension before sonicating the nanocrystalline diamond powder suspension.

18. The method of producing a thermal interface material layer on an electronic device of claim 17, wherein PEI is spin coated on the surface of the device interface end of an electronic device prior to the sonicated nanocrystalline diamond powder suspension being seeded on the surface of the device interface end of an electronic device.

19. The method of producing a thermal interface material layer on an electronic device of claim 18, wherein the spin coating is performed by operating a spin coater at substantially 1000 rpm for substantially one and a half (1.5) minutes followed by operating the spin coater at substantially 3000 rpm for substantially forty seconds at an acceleration value of 15.

* * * * *